(12) United States Patent
Tsukamoto et al.

(10) Patent No.: US 10,193,527 B2
(45) Date of Patent: Jan. 29, 2019

(54) BRANCHING FILTER

(71) Applicant: TDK CORPORATION, Tokyo (JP)

(72) Inventors: Kazuhiro Tsukamoto, Tokyo (JP); Hiroya Suzuki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 176 days.

(21) Appl. No.: 15/355,445

(22) Filed: Nov. 18, 2016

(65) Prior Publication Data
US 2017/0179930 A1 Jun. 22, 2017

(30) Foreign Application Priority Data

Dec. 17, 2015 (JP) ................. 2015-246203

(51) Int. Cl.
*H03H 9/54* (2006.01)
*H03H 9/64* (2006.01)
*H03H 9/70* (2006.01)
*H03H 9/72* (2006.01)
*H03H 7/075* (2006.01)
*H03H 7/01* (2006.01)

(52) U.S. Cl.
CPC ........... *H03H 9/542* (2013.01); *H03H 7/075* (2013.01); *H03H 7/175* (2013.01); *H03H 9/64* (2013.01); *H03H 9/703* (2013.01); *H03H 9/72* (2013.01)

(58) Field of Classification Search
CPC ........ H03H 7/075; H03H 7/175; H03H 9/542; H03H 9/64; H03H 9/703; H03H 9/72

USPC ......................................... 333/133
See application file for complete search history.

(56) References Cited

U.S. PATENT DOCUMENTS

| 6,879,224 B2 * | 4/2005 | Frank ................... H03H 7/0115 333/189 |
| 8,384,496 B2 | 2/2013 | Bauer et al. |
| 2002/0030555 A1 | 3/2002 | Mandai et al. |
| 2006/0067254 A1 * | 3/2006 | Mahbub ............... H03H 9/0576 370/282 |

FOREIGN PATENT DOCUMENTS

JP   H04-196829 A   7/1992

* cited by examiner

*Primary Examiner* — Robert J Pascal
*Assistant Examiner* — Jorge L Salazar, Jr.
(74) *Attorney, Agent, or Firm* — Oliff PLC

(57) ABSTRACT

A branching filter includes a low-pass filter provided between a common port and a first signal port, and a high-pass filter provided between the common port and a second signal port. The low-pass filter includes: a first LC resonant circuit; and a first acoustic wave resonator provided in a shunt circuit connecting a path leading from the first LC resonant circuit to the first signal port to a ground. The high-pass filter includes: a second LC resonant circuit; and a second acoustic wave resonator provided in a path leading from the second LC resonant circuit to the second signal port.

12 Claims, 9 Drawing Sheets

BRANCHING FILTER

BACKGROUND OF THE INVENTION

1. Field of the Invention

The present invention relates to a branching filter for separating a plurality of signals of mutually different frequencies from each other.

2. Description of the Related Art

Mobile communication systems conforming to the Long Term Evolution (LTE) standard have become practically used in recent years, and further, practical use of mobile communication systems conforming to the LTE-Advanced standard, which is an evolution of the LTE standard, is under study. Carrier Aggregation (CA) is one of the key technologies of the LTE-Advanced standard. CA uses multiple carriers called component carriers simultaneously to enable wideband transmission.

A mobile communication apparatus operable under CA uses multiple frequency bands simultaneously. Accordingly, such a mobile communication apparatus requires a branching filter capable of separating a plurality of signals in a plurality of frequency bands from each other simultaneously.

Typically, a branching circuit for separating two signals in mutually different frequency bands from each other includes a common port, a first signal port, a second signal port, a first filter provided in a first signal path leading from the common port to the first signal port, and a second filter provided in a second signal path leading from the common port to the second signal port.

The first and second filters can be LC filters formed using inductors and capacitors, or acoustic wave filters formed using acoustic wave resonators. The acoustic wave resonators are resonators formed using acoustic wave elements. The acoustic wave elements are elements that use acoustic waves. The acoustic wave elements include surface acoustic wave elements using surface acoustic waves, and bulk acoustic wave elements using bulk acoustic waves.

JP-H04-196829A discloses a branching circuit including an antenna terminal, a reception signal output terminal, a transmission signal input terminal, a transmission system between the antenna terminal and the reception signal output terminal, and a reception system between the antenna terminal and the reception signal output terminal. In this branching filter, each of the transmission system and the reception system includes a dielectric resonator and a surface acoustic wave filter connected in a cascade arrangement in this order from the antenna side.

U.S. Patent Application Publication No. 2002/0030555 A1 discloses a branching filter (duplexer) including first to third terminals, a branch circuit connected to the first terminal, a receiving-side LC parallel resonator-type filter, a surface acoustic wave filter, and a transmitting-side LC parallel resonator-type filter. The receiving-side LC parallel resonator-type filter and the surface acoustic wave filter are provided between the branch circuit and the second terminal in this order from the branch-circuit side. The transmitting-side LC parallel resonator-type filter is provided between the branch circuit and the third terminal.

U.S. Pat. No. 8,384,496 B2 discloses a band-stop filter including a first terminal, a second terminal, a first filter branch and a second filter branch connected in parallel between the first terminal and the second terminal, a band-pass filter arranged in the first filter branch, a high-pass filter arranged in the second filter branch, and a surface acoustic wave resonator provided in the path connecting the second filter branch to the ground.

Mobile communication apparatuses require miniaturization of components used therein. Mobile communication apparatuses may further require a branching filter for separating two signals in two mutually relatively close frequency bands from each other. Such a branching filter requires a filter having an insertion loss characteristic that abruptly changes in a frequency region close to the cut-off frequency.

For LC filters, typically, attempting to achieve an insertion loss characteristic that abruptly changes in a frequency region close to the cut-off frequency results in increase in size of the filters.

On the other hand, while acoustic wave filters are suitable to achieve an insertion loss characteristic that abruptly changes in a frequency region close to the cut-off frequency, they are not suitable to provide a wide passband.

Thus, it has conventionally been difficult to provide a branching filter that is suitable to separate two signals in two mutually relatively close frequency bands from each other and is miniaturizable.

OBJECT AND SUMMARY OF THE INVENTION

It is an object of the present invention to provide a branching filter that is suitable to separate two signals in two mutually relatively close frequency bands from each other and is miniaturizable.

A branching filter of a first to a third aspect of the present invention includes a common port, a first signal port, a second signal port, a low-pass filter, and a high-pass filter. The low-pass filter is provided between the common port and the first signal port, and configured to selectively pass a signal of a frequency within a first passband not higher than a first cut-off frequency. The high-pass filter is provided between the common port and the second signal port, and configured to selectively pass a signal of a frequency within a second passband not lower than a second cut-off frequency higher than the first cut-off frequency.

In the branching filter of the first aspect of the present invention, the low-pass filter includes: a first LC resonant circuit; and a first acoustic wave resonator provided in a shunt circuit connecting a path leading from the first LC resonant circuit to the first signal port to a ground. The first acoustic wave resonator has a resonant frequency higher than the first cut-off frequency.

In the branching filter of the first aspect of the present invention, the first LC resonant circuit may be an LC parallel resonant circuit including a first inductor and a first capacitor provided in parallel between the common port and the first signal port.

In the branching filter of the first aspect of the present invention, the first acoustic wave resonator has an anti-resonant frequency higher than the second cut-off frequency.

In the branching filter of the first aspect of the present invention, the first LC resonant circuit may have a resonant frequency higher than the resonant frequency of the first acoustic wave resonator.

In the branching filter of the second aspect of the present invention, the high-pass filter includes: a second LC resonant circuit; and a second acoustic wave resonator provided in a path leading from the second LC resonant circuit to the second signal port. The second acoustic wave resonator has an anti-resonant frequency lower than the second cut-off frequency.

In the branching filter of the second aspect of the present invention, the second LC resonant circuit may be an LC series resonant circuit including a second inductor and a second capacitor provided in series between a path leading from the common port to the second acoustic wave resonator and the ground.

In the branching filter of the second aspect of the present invention, the second acoustic wave resonator may have a resonant frequency lower than the first cut-off frequency.

In the branching filter of the second aspect of the present invention, the second LC resonant circuit may have a resonant frequency lower than the anti-resonant frequency of the second acoustic wave resonator.

In the branching filter of the third aspect of the present invention, the low-pass filter includes: a first LC resonant circuit; and a first acoustic wave resonator provided in a shunt circuit connecting a path leading from the first LC resonant circuit to the first signal port to a ground. The first acoustic wave resonator has a resonant frequency higher than the first cut-off frequency. The high-pass filter includes: a second LC resonant circuit; and a second acoustic wave resonator provided in a path leading from the second LC resonant circuit to the second signal port. The second acoustic wave resonator has an anti-resonant frequency lower than the second cut-off frequency.

In the branching filter of the third aspect of the present invention, the first LC resonant circuit may be an LC parallel resonant circuit including a first inductor and a first capacitor provided in parallel between the common port and the first signal port. The second LC resonant circuit may be an LC series resonant circuit including a second inductor and a second capacitor provided in series between a path leading from the common port to the second acoustic wave resonator and the ground.

In the branching filter of the third aspect of the present invention, the first acoustic wave resonator may have an anti-resonant frequency higher than the second cut-off frequency. The second acoustic wave resonator may have a resonant frequency lower than the first cut-off frequency.

In the branching filter of the third aspect of the present invention, the first LC resonant circuit may have a resonant frequency higher than the resonant frequency of the first acoustic wave resonator. The second LC resonant circuit may have a resonant frequency lower than the anti-resonant frequency of the second acoustic wave resonator.

In the branching filter of the first aspect of the present invention, the low-pass filter includes the first LC resonant circuit and the first acoustic wave resonator. This enables the low-pass filter to provide an insertion loss characteristic that abruptly changes in a frequency region close to the first cut-off frequency, without upsizing the branching filter.

In the branching filter of the second aspect of the present invention, the high-pass filter includes the second LC resonant circuit and the second acoustic wave resonator. This enables the high-pass filter to provide an insertion loss characteristic that abruptly changes in a frequency region close to the second cut-off frequency, without upsizing the branching filter.

In the branching filter of the third aspect of the present invention, the low-pass filter includes the first LC resonant circuit and the first acoustic wave resonator, and the high-pass filter includes the second LC resonant circuit and the second acoustic wave resonator. This configuration enables the low-pass filter to provide an insertion loss characteristic that abruptly changes in a frequency region close to the first cut-off frequency, and enables the high-pass filter to provide an insertion loss characteristic that abruptly changes in a frequency region close to the second cut-off frequency, without upsizing the branching filter.

Thus, the first to third aspects of the present invention provide a branching filter that is suitable to separate two signals in two mutually relatively close frequency bands from each other and is miniaturizable.

Other and further objects, features and advantages of the invention will appear more fully from the following description.

DETAILED DESCRIPTION OF THE PREFERRED EMBODIMENTS

[First Embodiment]

Figure 1:
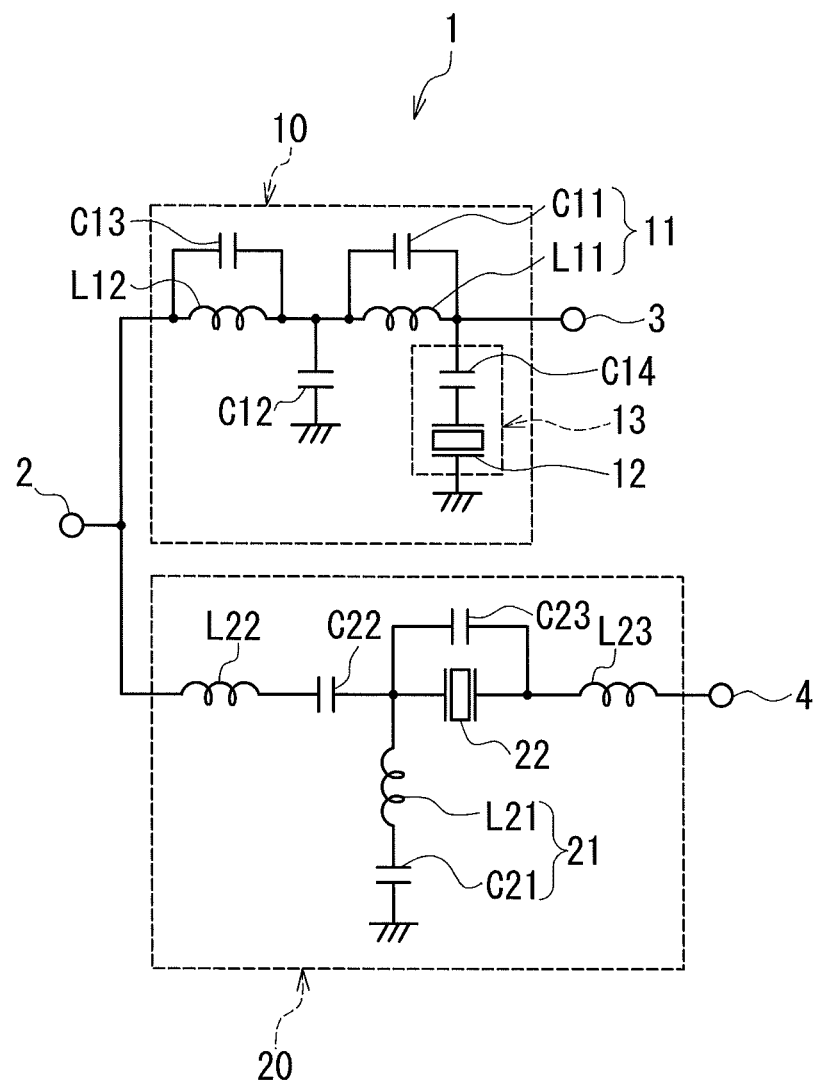
FIG. 1 is a circuit diagram illustrating the configuration of a branching filter according to a first embodiment of the invention.

Preferred embodiments of the present invention will now be described in detail with reference to the drawings. First, reference is made to FIG. 1 to describe the configuration of a branching filter according to a first embodiment of the invention. The branching filter 1 according to the first embodiment is configured to separate a first signal of a frequency within a first frequency band and a second signal of a frequency within a second frequency band higher than the first frequency band from each other. The branching filter 1 includes a common port 2, a first signal port 3, a second signal port 4, a low-pass filter 10, and a high-pass filter 20.

The low-pass filter 10 is provided between the common port 2 and the first signal port 3 and selectively passes a signal of a frequency within a first passband not higher than a first cut-off frequency $f_L$. The first passband is the same as the first frequency band mentioned above. The first cut-off frequency $f_L$ is a frequency at which the insertion loss characteristic of the low-pass filter 10 shows an increase of attenuation by 3 dB compared with the minimum value of attenuation.

The high-pass filter 20 is provided between the common port 2 and the second signal port 4 and selectively passes a signal of a frequency within a second passband not lower than a second cut-off frequency $f_H$ higher than the first cut-off frequency $f_L$. The second passband is the same as the second frequency band mentioned above. The second cut-off frequency $f_H$ is a frequency at which the insertion loss characteristic of the high-pass filter 20 shows an increase of attenuation by 3 dB compared with the minimum value of attenuation.

The low-pass filter 10 includes a first LC resonant circuit 11 and a first acoustic wave resonator 12. The first acoustic wave resonator 12 is provided in a shunt circuit 13 connecting a path leading from the first LC resonant circuit 11 to the first signal port 3 to the ground.

The first LC resonant circuit 11 is a resonant circuit formed using an inductor and a capacitor. In the first embodiment, the first LC resonant circuit 11 is particularly an LC parallel resonant circuit including a first inductor L11 and a first capacitor C11 provided in parallel between the common port 2 and the first signal port 3. The first LC resonant circuit 11 has a resonant frequency fc1 higher than the first cut-off frequency $f_L$.

The first acoustic wave resonator 12 is a resonator formed using an acoustic wave element. The acoustic wave element is an element that uses acoustic waves. The acoustic wave element used to form the first acoustic wave resonator 12 may be a surface acoustic wave element using surface acoustic waves or a bulk acoustic wave element using bulk acoustic waves. The surface acoustic wave element uses surface acoustic waves, i.e., acoustic waves that propagate across the surface of a piezoelectric material, whereas the bulk acoustic wave element uses bulk acoustic waves, i.e., acoustic waves that propagate internally through a piezoelectric material.

The first acoustic wave resonator 12 has a resonant frequency fr1 and an anti-resonant frequency fa1. The resonant frequency fr1 is a frequency at which the first acoustic wave resonator 12 has a minimum impedance (maximum admittance). The anti-resonant frequency fa1 is a frequency at which the first acoustic wave resonator 12 has a minimum admittance (maximum impedance). The anti-resonant frequency fa1 is higher than the resonant frequency fr1. In the first embodiment, the resonant frequency fr1 is higher than the first cut-off frequency $f_L$. The anti-resonant frequency fa1 may be higher than the second cut-off frequency $f_H$. The first LC resonant circuit 11 may have a resonant frequency fc1 higher than the resonant frequency fr1.

The low-pass filter 10 further includes an inductor L12 and capacitors C12, C13 and C14.

The inductor L12 is provided between the common port 2 and the first LC resonant circuit 11. The capacitor C12 is provided between the ground and the connection point between the inductor L12 and the first LC resonant circuit 11. The capacitor C13 is connected in parallel to the inductor L12. The low-pass filter 10 may not include the capacitor C13.

The capacitor C14 is provided in the shunt circuit 13 at a location between the first acoustic wave resonator 12 and the path leading from the first LC resonant circuit 11 to the first signal port 3. The capacitor C14 is provided for adjusting the resonant frequency fr1 and the anti-resonant frequency fa1 of the first acoustic wave resonator 12 as necessary. The capacitor C14 may thus be omitted from the low-pass filter 10. Alternatively, the capacitor C14 may be replaced with a capacitor connected in parallel to the first acoustic wave resonator 12 in the low-pass filter 10.

The high-pass filter 20 includes a second LC resonant circuit 21 and a second acoustic wave resonator 22. The second acoustic wave resonator 22 is provided in a path leading from the second LC resonant circuit 21 to the second signal port 4.

The second LC resonant circuit 21 is a resonant circuit formed using an inductor and a capacitor. In the first embodiment, the second LC resonant circuit 21 is particularly an LC series resonant circuit including a second inductor L21 and a second capacitor C21 provided in series between a path leading from the common port 2 to the second acoustic wave resonator 22 and the ground. While FIG. 1 illustrates an example in which the second capacitor C21 is located closer to the ground than is the second inductor L21, the second inductor L21 may be located closer to the ground than is the second capacitor C21. The second LC resonant circuit 21 has a resonant frequency fc2 lower than the second cut-off frequency $f_H$.

The second acoustic wave resonator 22 is a resonator formed using an acoustic wave element, as is the first acoustic wave resonator 12. The acoustic wave element used to form the second acoustic wave resonator 22 may be a surface acoustic wave element or a bulk acoustic wave element.

The second acoustic wave resonator 22 has a resonant frequency fr2 and an anti-resonant frequency fa2. The resonant frequency fr2 is a frequency at which the second acoustic wave resonator 22 has a minimum impedance (maximum admittance). The anti-resonant frequency fa2 is a frequency at which the second acoustic wave resonator 22 has a minimum admittance (maximum impedance). The anti-resonant frequency fa2 is higher than the resonant frequency fr2. In the first embodiment, the anti-resonant frequency fa2 is lower than the second cut-off frequency $f_H$. The resonant frequency fr2 may be lower than the first cut-off frequency $f_L$. The second LC resonant circuit 21 may have a resonant frequency fc2 lower than the anti-resonant frequency fa2.

The high-pass filter 20 further includes capacitors C22 and C23 and inductors L22 and L23.

The capacitor C22 is provided between the second acoustic wave resonator 22 and the common port 2. The inductor L22 is provided between the common port 2 and the capacitor C22. The inductor L23 is provided between the second acoustic wave resonator 22 and the second signal port 4. One or both of the inductors L22 and L23 may be omitted from the high-pass filter 20.

The capacitor C23 is connected in parallel to the second acoustic wave resonator 22. The capacitor C23 is provided for adjusting the resonant frequency fr2 and the anti-resonant frequency fa2 of the second acoustic wave resonator 22 as necessary. The capacitor C23 may thus be omitted from the high-pass filter 20. Alternatively, the capacitor C23 may be replaced with a capacitor connected in series to the second acoustic wave resonator 22 in the high-pass filter 20.

Now, the path leading from the common port 2 to the first signal port 3 will be referred to as the first signal path, and the path leading from the common port 2 to the second signal port 4 will be referred to as the second signal path. The first signal of a frequency within the first frequency band (the first passband) selectively passes through the first signal path and not through the second signal path. The second signal of a frequency within the second frequency band (the second passband) selectively passes through the second signal path and not through the first signal path.

Figure 2:
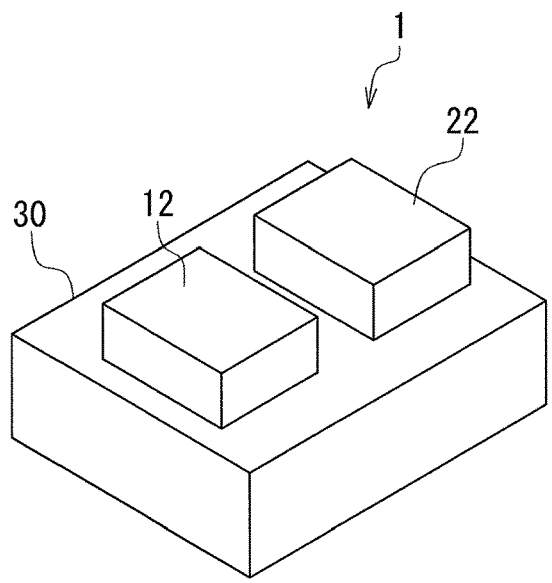
FIG. 2 is a perspective view illustrating an example of the external appearance of the branching filter according to the first embodiment of the invention.

FIG. 2 is a perspective view illustrating an example of the external appearance of the branching filter 1. The branching filter 1 of this example includes a stack 30 and the first and second acoustic wave resonators 12 and 22. The stack 30 is shaped like a rectangular solid and has a periphery. The periphery of the stack 30 includes a top surface, a bottom surface and four side surfaces.

The stack 30 includes dielectric layers and conductor layers stacked on each other. Components of the branching filter 1 other than the first and second acoustic wave resonators 12 and 22 are formed using the dielectric layers and conductor layers of the stack 30. The first and second acoustic wave resonators 12 and 22 are mounted on the top surface of the stack 30. The first and second acoustic wave resonators 12 and 22 may be combined into a package and the package may be mounted on the top surface of the stack 30.

Although not illustrated, three terminals corresponding to the common port 2, the first signal port 3 and the second signal port 4, and a terminal to be connected to the ground are provided on the bottom surface of the stack 30.

Figure 3:
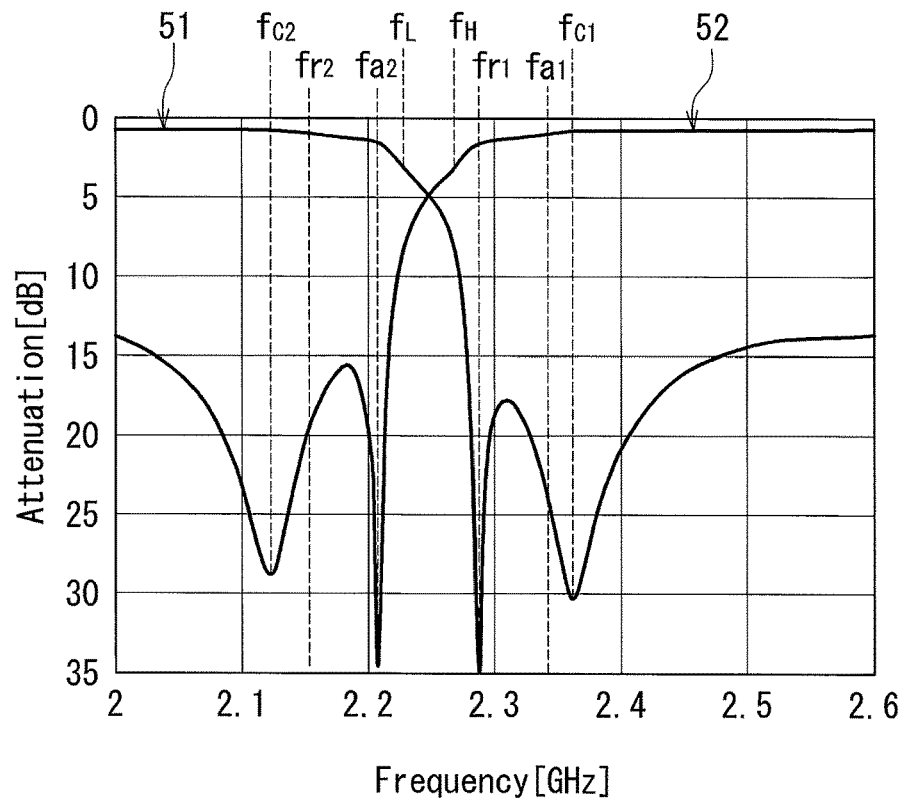
FIG. 3 is a characteristic diagram illustrating an example of characteristics of the branching filter according to the first embodiment of the invention.
Figure 4:
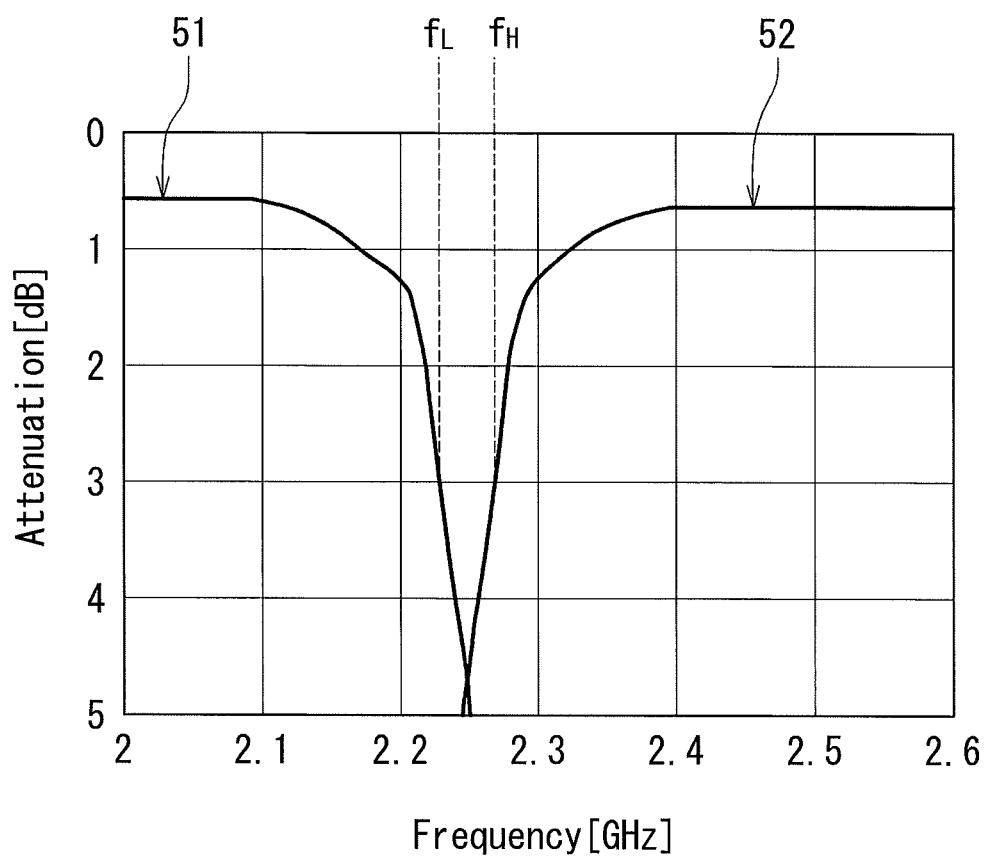
FIG. 4 is a characteristic diagram providing an enlarged view of a portion of the characteristic shown in FIG. 3.

The features of the branching filter 1 will now be described with reference to FIGS. 3 and 4. FIG. 3 is a characteristic diagram illustrating an example of characteristics of the branching filter 1. FIG. 4 is a characteristic diagram providing an enlarged view of a portion of the characteristic shown in FIG. 3. In FIGS. 3 and 4, the horizontal axis represents frequency, and the vertical axis represents attenuation. In FIGS. 3 and 4, the curve 51 shows the insertion loss characteristic of the low-pass filter 10, and the curve 52 shows the insertion loss characteristic of the high-pass filter 20. The characteristics shown in FIGS. 3 and 4 were determined by simulation.

The features of the low-pass filter 10 will be described first. The first LC resonant circuit 11 of the low-pass filter 10 has the resonant frequency fc1 higher than the first cut-off frequency $f_L$. Consequently, as shown in FIG. 3, the insertion loss characteristic 51 of the low-pass filter 10 shows a first attenuation pole at the resonant frequency fc1 outside the passband of the low-pass filter 10.

In the low-pass filter 10, the first acoustic wave resonator 12 provided in the shunt circuit 13 has a minimum impedance at the resonant frequency fr1. The resonant frequency fr1 is higher than the first cut-off frequency $f_L$. Consequently, as shown in FIG. 3, the insertion loss characteristic 51 of the low-pass filter 10 shows a second attenuation pole at the resonant frequency fr1 outside the passband of the low-pass filter 10.

According to the first embodiment, by making the resonant frequency fr1 of the first acoustic wave resonator 12 lower than the resonant frequency fc1 of the first LC resonant circuit 11, the low-pass filter 10 provides an insertion loss characteristic that abruptly changes in a frequency region close to the first cut-off frequency $f_L$, as shown in FIG. 3.

The low-pass filter 10 of the first embodiment has the following first and second features, in particular. The first feature is the creation of the second attenuation pole by using the series resonance of the first acoustic wave resonator 12, which is provided in the shunt circuit 13, at the resonant frequency fr1. The second feature is the provision of the first LC resonant circuit 11 and the first acoustic wave resonator 12 in the low-pass filter 10. The effects of the combination of the first and second features will now be described with reference to FIG. 5.

Figure 5:
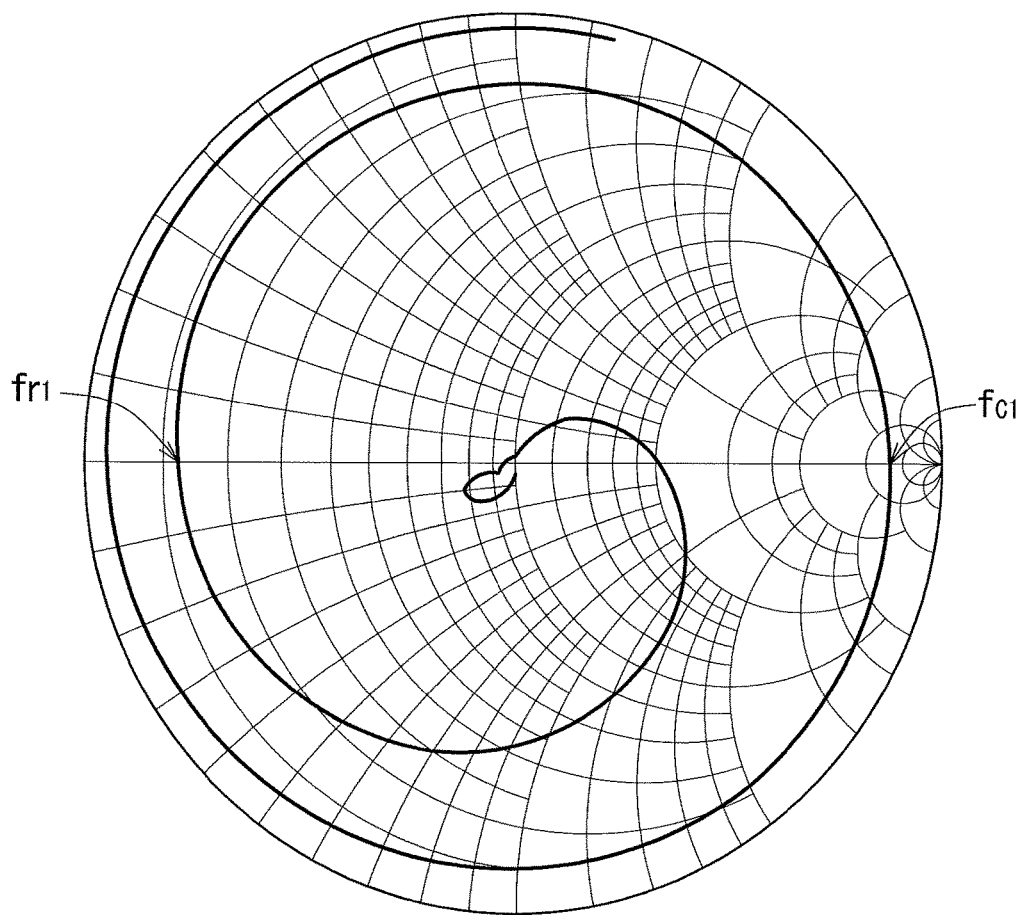
FIG. 5 is an explanatory diagram illustrating an impedance characteristic of a low-pass filter of the branching filter shown in FIG. 1.

FIG. 5 is a Smith chart showing the impedance characteristic of the low-pass filter 10 as viewed from the first signal port 3. In FIG. 5, the point fr1 indicates the impedance of the low-pass filter 10 as viewed from the first signal port 3 at the resonant frequency fr1 of the first acoustic wave resonator 12, and the point fc1 indicates the impedance of the low-pass filter 10 as viewed from the first signal port 3 at the resonant frequency fc1 of the first LC resonant circuit 11.

At the resonant frequency fr1, the impedance of the first acoustic wave resonator 12 becomes minimum to increase the absolute value of the reflection coefficient of the low-pass filter 10, as shown in FIG. 5. This creates the second attenuation pole at the resonant frequency fr1 in the insertion loss characteristic of the low-pass filter 10.

On the other hand, the admittance of the first acoustic wave resonator 12 is minimum at the anti-resonant frequency fa1. Without the first LC resonant circuit 11 in the low-pass filter 10, the reflection coefficient of the low-pass filter 10 would locally decrease in absolute value at the anti-resonant frequency fa1. This would locally increase attenuation at the anti-resonant frequency fa1 in the insertion loss characteristic of the high-pass filter 20, thus resulting in degradation of the insertion loss characteristic of the high-pass filter 20. This problem is especially noticeable when, as shown in FIG. 3, the anti-resonant frequency fa1 is higher than the second cut-off frequency $f_H$, that is, when the anti-resonant frequency fa1 is within the passband of the high-pass filter 20.

In the first embodiment, in contrast, since the low-pass filter 10 includes the first LC resonant circuit 11, the reflection coefficient of the low-pass filter 10 has a large absolute value at the resonant frequency fc1 of the first LC resonant circuit 11, as shown in FIG. 5. As shown in FIG. 3, the resonant frequency fc1 of the first LC resonant circuit 11 is higher than the resonant frequency fr1 of the first acoustic wave resonator 12. The anti-resonant frequency fa1 of the first acoustic wave resonator 12 is also higher than the resonant frequency fr1. The resonant frequency fc1 of the first LC resonant circuit 11 and the anti-resonant frequency fa1 of the first acoustic wave resonator 12 are thus relatively close to each other. This prevents the aforementioned problem of degradation of the insertion loss characteristic of the high-pass filter 20 associated with the anti-resonant frequency fa1.

Next, the features of the high-pass filter 20 will be described. The second LC resonant circuit 21 of the high-pass filter 20 has the resonant frequency fc2 lower than the second cut-off frequency $f_H$. Consequently, as shown in FIG. 3, the insertion loss characteristic 52 of the high-pass filter 20 shows a third attenuation pole at the resonant frequency fc2 outside the passband of the high-pass filter 20.

In the high-pass filter 20, the second acoustic wave resonator 22 provided in the path leading from the second LC resonant circuit 21 to the second signal port 4 has a minimum admittance at the anti-resonant frequency fa2. The anti-resonant frequency fa2 is lower than the second cut-off frequency $f_H$. Consequently, as shown in FIG. 3, the insertion loss characteristic 52 of the high-pass filter 20 shows a fourth attenuation pole at the anti-resonant frequency fa2 outside the passband of the high-pass filter 20.

According to the first embodiment, by making the anti-resonant frequency fa2 of the second acoustic wave resonator 22 higher than the resonant frequency fc2 of the second LC resonant circuit 21, the high-pass filter 20 provides an insertion loss characteristic that abruptly changes in a frequency region close to the second cut-off frequency $f_H$, as shown in FIG. 3.

The high-pass filter 20 according to the first embodiment has the following third and fourth features, in particular. The third feature is the creation of the fourth attenuation pole by using the parallel resonance of the second acoustic wave resonator 22, which is provided in the path leading from the second LC resonant circuit 21 to the second signal port 4, at the anti-resonant frequency fa2. The fourth feature is the provision of the second LC resonant circuit 21 and the second acoustic wave resonator 22 in the high-pass filter 20. The effects of the combination of the third and fourth features will now be described with reference to FIG. 6.

Figure 6:
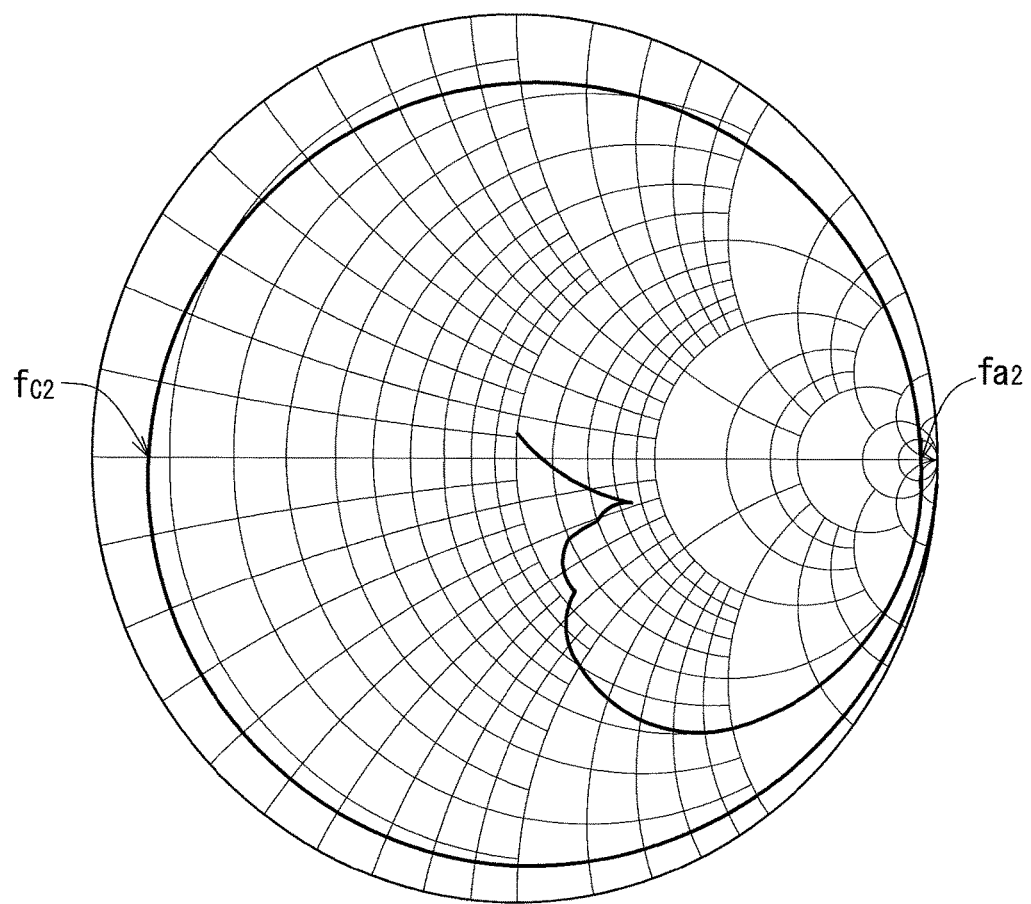
FIG. 6 is an explanatory diagram illustrating an impedance characteristic of a high-pass filter of the branching filter shown in FIG. 1.

FIG. 6 is a Smith chart showing the impedance characteristic of the high-pass filter 20 as viewed from the second signal port 4. In FIG. 6, the point fa2 indicates the impedance of the high-pass filter 20 as viewed from the second signal port 4 at the anti-resonant frequency fa2 of the second acoustic wave resonator 22, and the point fc2 indicates the impedance of the high-pass filter 20 as viewed from the second signal port 4 at the resonant frequency fc2 of the second LC resonant circuit 21.

At the anti-resonant frequency fa2, the admittance of the second acoustic wave resonator 22 becomes minimum to increase the absolute value of the reflection coefficient of the high-pass filter 20, as shown in FIG. 6. This creates the fourth attenuation pole at the anti-resonant frequency fa2 in the insertion loss characteristic of the high-pass filter 20.

On the other hand, the impedance of the second acoustic wave resonator 22 is minimum at the anti-resonant frequency fa2. Without the second LC resonant circuit 21 in the high-pass filter 20, the reflection coefficient of the high-pass filter 20 would locally decrease in absolute value at the resonant frequency fr2. This would locally increase attenuation at the resonant frequency fr2 in the insertion loss characteristic of the low-pass filter 10, thus resulting in degradation of the insertion loss characteristic of the low-pass filter 10. This problem is especially noticeable when, as shown in FIG. 3, the resonant frequency fr2 is lower than the first cut-off frequency $f_L$, that is, when the resonant frequency fr2 is within the passband of the low-pass filter 10.

In the first embodiment, in contrast, since the high-pass filter 20 includes the second LC resonant circuit 21, the reflection coefficient of the high-pass filter 20 has a large absolute value at the resonant frequency fc2 of the second LC resonant circuit 21, as shown in FIG. 6. As shown in FIG. 3, the resonant frequency fc2 of the second LC resonant circuit 21 is lower than the anti-resonant frequency fa2 of the second acoustic wave resonator 22. The resonant frequency fr2 of the second acoustic wave resonator 22 is also lower than the anti-resonant frequency fa2. The resonant frequency fc2 of the second LC resonant circuit 21 and the resonant frequency fr2 of the second acoustic wave resonator 22 are thus relatively close to each other. This prevents the aforementioned problem of degradation of the insertion loss characteristic of the low-pass filter 10 associated with the resonant frequency fr2.

Figure 7:
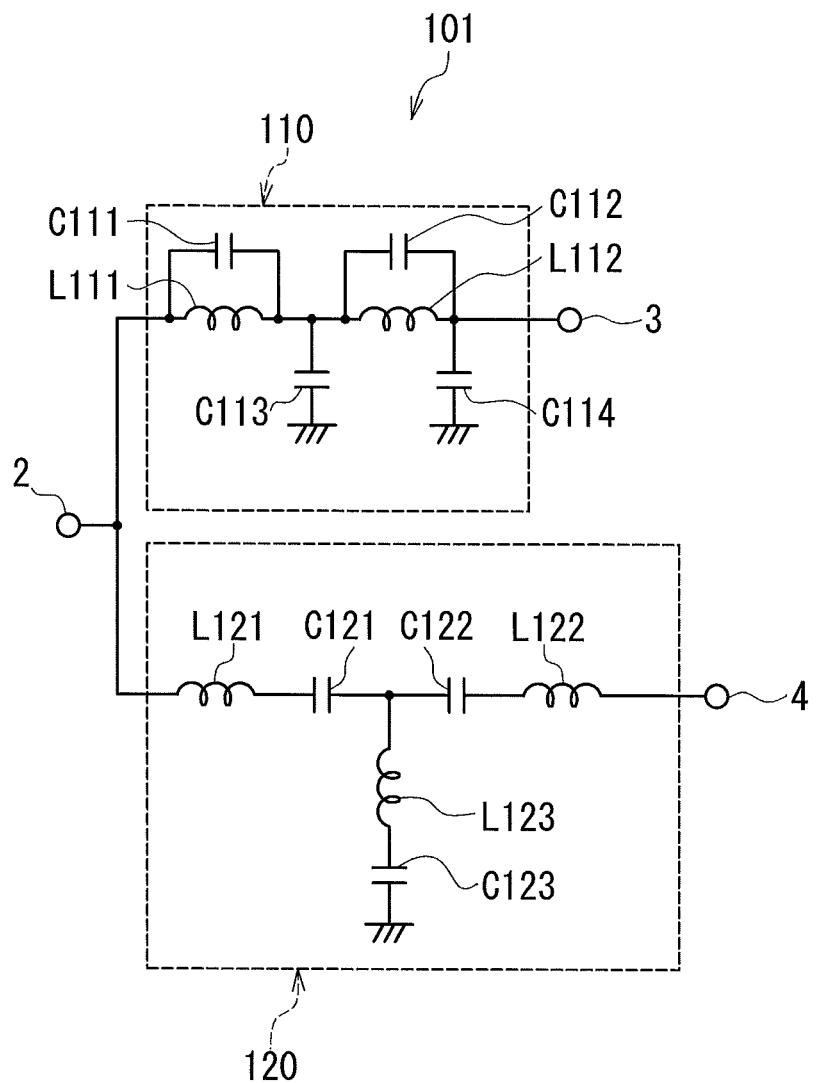
FIG. 7 is a circuit diagram illustrating the configuration of a branching filter of a comparative example.

The effects of the branching filter 1 according to the first embodiment will now be described in more detail in comparison with a branching filter of a comparative example. First, the configuration of the branching filter 101 of the comparative example will be described with reference to FIG. 7. The branching filter 101 includes a low-pass filter 110 and a high-pass filter 120, in place of the low-pass filter 10 and the high-pass filter 20 of the branching filter 1 according to the first embodiment.

The low-pass filter 110 includes an inductor L111 and an inductor L112 provided between the common port 2 and the first signal port 3. The inductors L111 and L112 are arranged in series in this order from the common-port-2 side. The low-pass filter 110 further includes a capacitor C111 connected in parallel to the inductor L111, and a capacitor C112 connected in parallel to the inductor L112. The low-pass filter 110 further includes: a capacitor C113 provided between the ground and the connection point between the inductor L111 and the inductor L112; and a capacitor C114 provided between the first signal port 3 and the ground.

The high-pass filter 120 includes an inductor L121, a capacitor C121, a capacitor C122, and an inductor L122 provided between the common port 2 and the second signal port 4. These inductors and capacitors are arranged in series in the above-listed order from the common-port-2 side. The high-pass filter 120 further includes an inductor L123 and a capacitor C123 provided between the ground and the connection point between the capacitor C121 and the capacitor C122. The inductor L123 and the capacitor C123 are arranged in series in this order from the connection point side.

Figure 8:
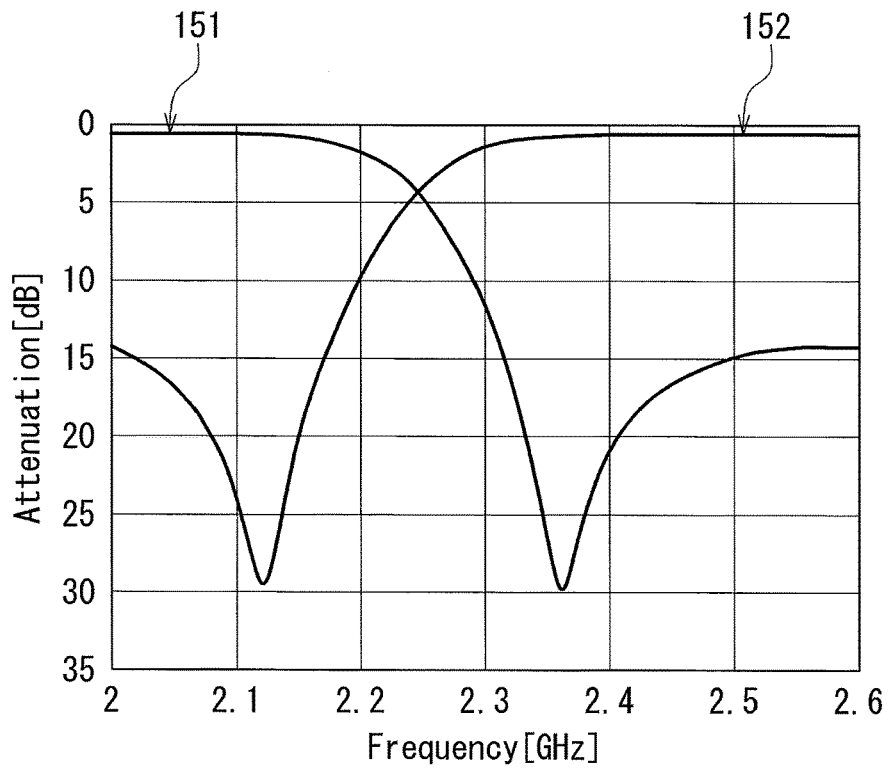
FIG. 8 is a characteristic diagram illustrating an example of characteristics of the branching filter of the comparative example.
Figure 9:
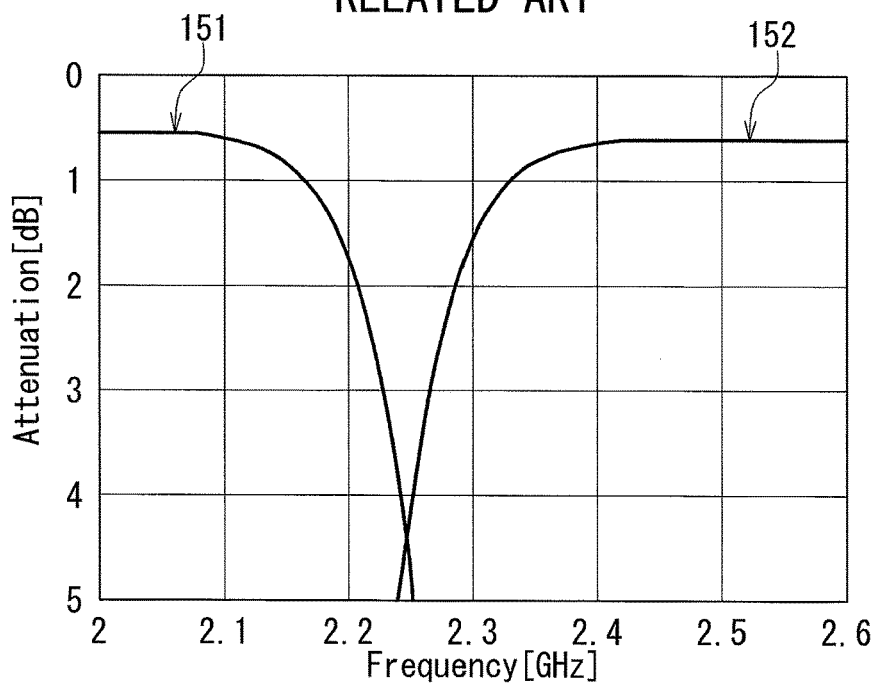
FIG. 9 is a characteristic diagram providing an enlarged view of a portion of the characteristic shown in FIG. 8.

FIG. 8 is a characteristic diagram illustrating an example of characteristics of the branching filter 101 of the comparative example. FIG. 9 is a characteristic diagram providing an enlarged view of a portion of the characteristic shown in FIG. 8. In FIGS. 8 and 9, the horizontal axis represents frequency, and the vertical axis represents attenuation. In FIGS. 8 and 9, the curve 151 shows the insertion loss characteristic of the low-pass filter 110, and the curve 152 shows the insertion loss characteristic of the high-pass filter 120. The characteristics shown in FIGS. 8 and 9 were determined by simulation.

When compared with the insertion loss characteristic 151 shown in FIGS. 8 and 9, the insertion loss characteristic 51 shown in FIGS. 3 and 4 changes more abruptly in a frequency region close to the first cut-off frequency $f_L$. As a result, the low-pass filter 10 shows a smaller attenuation at a frequency within the first passband and close to the first cut-off frequency $f_L$, when compared with the attenuation of the low-pass filter 110 at the same frequency. For example, the low-pass filter 110 shows an attenuation of 1.754 dB at 2.2 GHz, whereas the low-pass filter 10 shows an attenuation of 1.272 dB at 2.2 GHz.

Further, when compared with the insertion loss characteristic 152 shown in FIGS. 8 and 9, the insertion loss characteristic 52 shown in FIGS. 3 and 4 changes more abruptly in a frequency region close to the second cut-off frequency $f_H$. As a result, the high-pass filter 20 shows a smaller attenuation at a frequency within the second passband and close to the second cut-off frequency $f_H$, when compared with the attenuation of the high-pass filter 120 at the same frequency. For example, the high-pass filter 120 shows an attenuation of 1.544 dB at 2.3 GHz, whereas the high-pass filter 20 shows an attenuation of 1.248 dB at 2.3 GHz.

As has been described, the present embodiment allows the low-pass filter 10 to provide an insertion loss characteristic that abruptly changes in a frequency region close to the first cut-off frequency $f_L$, and allows the high-pass filter 20 to provide an insertion loss characteristic that abruptly changes in a frequency region close to the second cut-off frequency $f_H$.

For a low-pass filter and a high-pass filter each formed using an LC filter, any attempts to achieve an insertion loss characteristic that abruptly changes in a frequency region close to the cut-off frequency would necessitate a large number of stages or a large inductor to obtain a high Q value. This would result in upsizing of the low-pass filter and the high-pass filter.

In the present embodiment, the low-pass filter 10 includes the first acoustic wave resonator 12, and the high-pass filter 20 includes the second acoustic wave resonator 22. When compared with LC resonators, acoustic wave resonators are typically able to provide higher Q values. More specifically, typical LC resonators provide Q values in the range of 50 to 100, whereas acoustic wave resonators provide Q values of 200 or higher. The first and second acoustic wave resonators 12 and 22 provide Q values of 200 or higher, e.g., 600 to 1000. The present embodiment thus achieves the above-described insertion loss characteristics of the low-pass filter 10 and the high-pass filter 20 without upsizing the inductors or increasing the number of stages.

The present embodiment thus provides the branching circuit 1 which is suitable to separate two signals in two mutually relatively close frequency bands from each other and is small in size.

Figure 10:
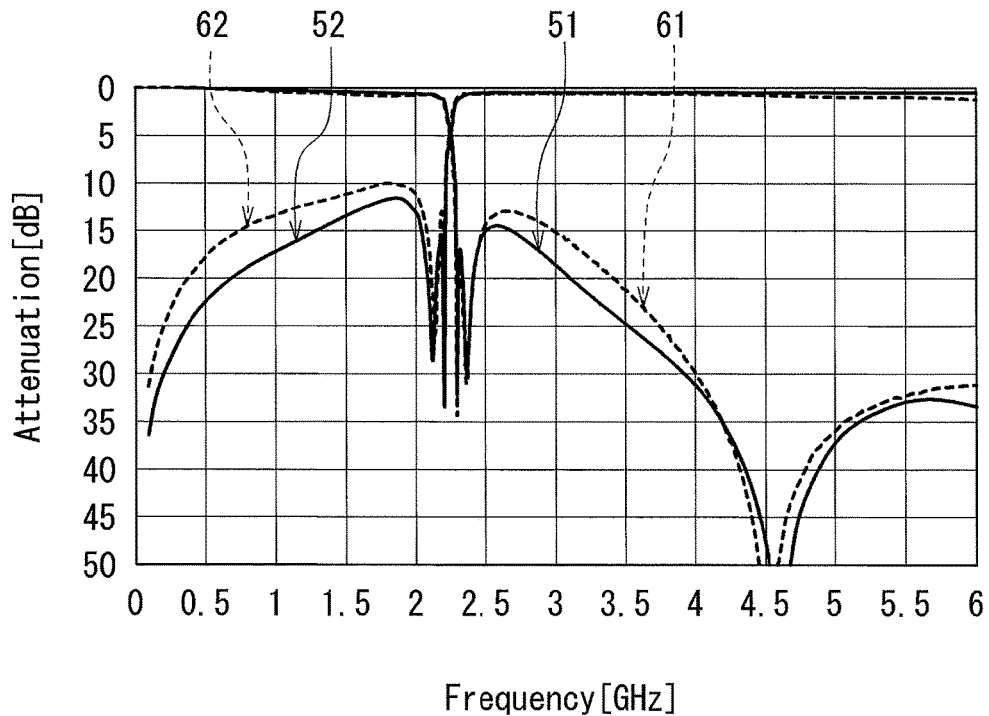
FIG. 10 is a characteristic diagram for explaining the functions of two inductors in the high-pass filter of the branching filter shown in FIG. 1.

Now, the functions of the inductors L22 and L23 in the high-pass filter 20 will be described with reference to FIG. 10. FIG. 10 shows the insertion loss characteristic 51 of the low-pass filter 10 and the insertion loss characteristic 52 of the high-pass filter 20 in a broader frequency region than in FIG. 3. In FIG. 10 the horizontal axis represents frequency, and the vertical axis represents attenuation.

In FIG. 10, the broken lines 61 and 62 respectively indicate insertion loss characteristics of the low-pass filter 10 and the high-pass filter 20 that would be obtained without the inductors L22 and L23 in the high-pass filter 20.

With the inductors L22 and L23 provided in the high-pass filter 20, the capacitors C22 and C23 have smaller capacitances than in the case without the inductors L22 and L23. As a result, as shown in FIG. 10, the low-pass filter 10 provides a greater attenuation in a frequency region higher than the frequency fc1 (see FIG. 3) at which the first attenuation pole occurs, and the high-pass filter 20 provides a greater attenuation in a frequency region lower than the frequency fc2 (see FIG. 3) at which the third attenuation pole occurs.

In the present embodiment, the low-pass filter 10 may have any other configuration than that shown in FIG. 1. Components of the low-pass filter 10 other than the first LC resonant circuit 11 and the first acoustic wave resonator 12 may be located closer to the common port 2 or closer to the first signal port 3 than are the first LC resonant circuit 11 and the first acoustic wave resonator 12.

Similarly, the high-pass filter 20 may have any other configuration than that shown in FIG. 1. Components of the high-pass filter 20 other than the second LC resonant circuit 21 and the second acoustic wave resonator 22 may be located closer to the common port 2 or closer to the second signal port 4 than are the second LC resonant circuit 21 and the second acoustic wave resonator 22.

The branching filter of the present invention may be one including the low-pass filter 10 configured to include the first LC resonant circuit 11 and the first acoustic wave resonator 12, and a high-pass filter of any configuration. The branching filter in this case provides at least the effect that the low-pass filter 10 achieves an insertion loss characteristic that abruptly changes in a frequency region close to the first cut-off frequency $F_L$, without upsizing the branching filter.

Alternatively, the branching filter of the present invention may be one including the high-pass filter 20 configured to include the second LC resonant circuit 21 and the second acoustic wave resonator 22, and a low-pass filter of any configuration. The branching filter in this case provides at least the effect that the high-pass filter 20 achieves an insertion loss characteristic that abruptly changes in a frequency region close to the second cut-off frequency $F_H$, without upsizing the branching filter.

[Second Embodiment]

Figure 11:
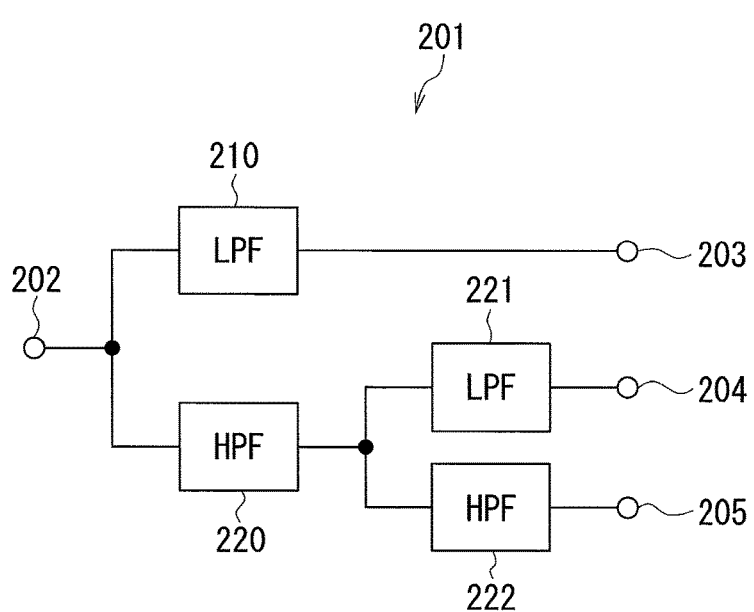
FIG. 11 is a block diagram illustrating the configuration of a branching filter according to a second embodiment of the invention.

A branching filter according to a second embodiment of the invention will now be described. FIG. 11 is a block diagram illustrating the configuration of the branching filter according to the second embodiment. The branching filter 201 according to the second embodiment is configured to separate three signals of frequencies within three mutually different frequency bands from each other. The three mutually different frequency bands will be referred to as the low band, the middle band, and the high band, from lowest to highest.

The branching filter 201 according to the second embodiment includes a common port 202 and three signal ports 203, 204 and 205. The branching filter 201 further includes a low-pass filter 210, a high-pass filter 220, a low-pass filter 221, and a high-pass filter 222. The low-pass filter 210, the high-pass filter 220, the low-pass filter 221, and the high-pass filter 222 will be referred to as LPF 210, HPF 220, LPF 221, and HPF 222, respectively.

LPF 210 is provided between the common port 202 and the signal port 203. HPF 220 has a first port and a second port for receiving and outputting signals, respectively. The first port of HPF 220 is connected to the common port 202. LPF 221 is provided between the second port of HPF 220 and the signal port 204. HPF 222 is provided between the second port of HPF 220 and the signal port 205.

LPF 210 selectively passes signals of frequencies within the low band. HPF 220 selectively passes signals of frequencies within the middle band and signals of frequencies within the high band. LPF 221 selectively passes signals of frequencies within the middle band. HPF 222 selectively passes signals of frequencies within the high band.

Now, the path leading from the common port 202 to the signal port 203 via LPF 210 will be referred to as the low band path. The path leading from the common port 202 to the signal port 204 via HPF 220 and LPF 221 will be referred to as the middle band path. The path leading from the common port 202 to the signal port 205 via HPF 220 and HPF 222 will be referred to as the high band path. Signals of frequencies within the low band selectively pass through the low band path. Signals of frequencies within the middle band selectively pass through the middle band path. Signals of frequencies within the high band selectively pass through the high band path.

In the second embodiment, for example, LPF 221 has the same configuration as the low-pass filter 10 of the first embodiment, and HPF 222 has the same configuration as the high-pass filter 20 of the first embodiment. In this case, the second port of HPF 220 corresponds to the common port of the present invention, and the signal ports 204 and 205 correspond to the first and second signal ports of the present invention, respectively.

Figure 12:
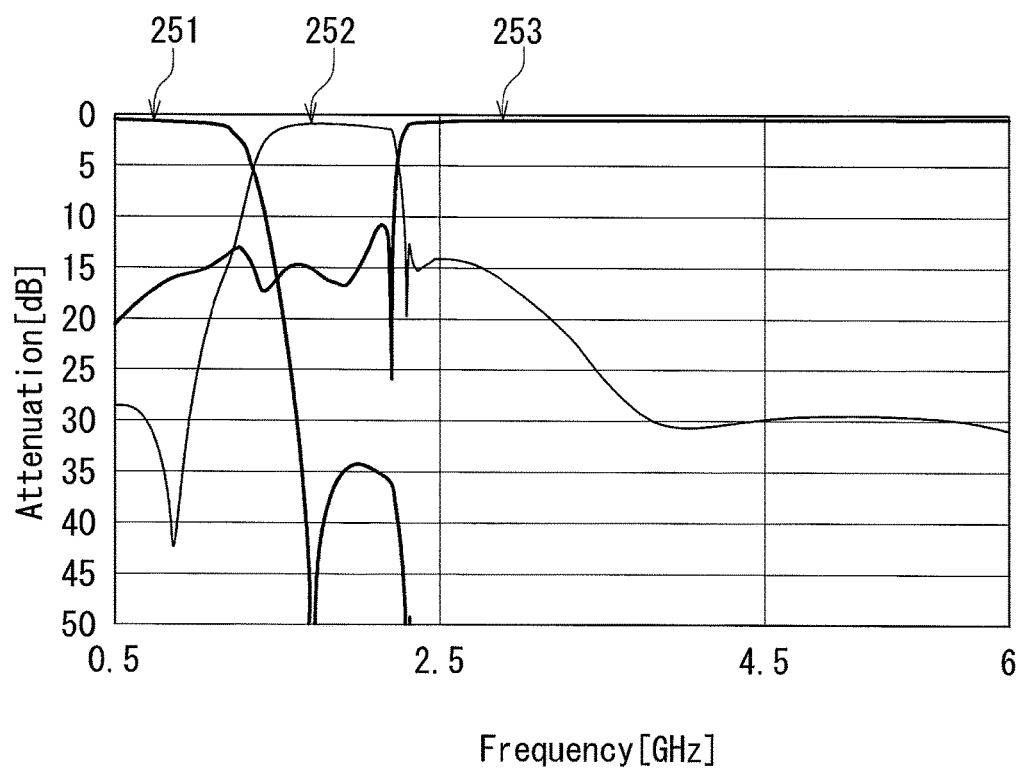
FIG. 12 is a characteristic diagram illustrating an example of characteristics of the branching filter according to the second embodiment of the invention.

FIG. 12 is a characteristic diagram illustrating an example of characteristics of the branching filter 201. In FIG. 12, the horizontal axis represents frequency, and the vertical axis represents attenuation. In FIG. 12, the curve 251 shows the insertion loss characteristic of the low band path, the curve 252 shows the insertion loss characteristic of the middle band path, and the curve 253 shows the insertion loss characteristic of the high band path. The characteristics shown in FIG. 12 were determined by simulation.

In the second embodiment, LPF 221 provides the same effects as the low-pass filter 10 of the first embodiment, and HPF 222 provides the same effects as the high-pass filter 20 of the first embodiment.

The remainder of configuration, operation and effects of the second embodiment are similar to those of the first embodiment.

The present invention is not limited to the foregoing embodiments, and various modifications may be made thereto. For example, characteristics of the low-pass filter and the high-pass filter in the present invention are not limited to those illustrated in the foregoing embodiments, and can be freely designed as far as the requirements of the appended claims are met.

Obviously, many modifications and variations of the present invention are possible in the light of the above teachings. Thus, it is to be understood that, within the scope of the appended claims and equivalents thereof, the invention may be practiced in other than the foregoing most preferable embodiments.

What is claimed is:

1. A branching filter comprising:
    a common port;
    a first signal port;
    a second signal port;
    a low-pass filter provided between the common port and the first signal port, and configured to selectively pass a signal of a frequency within a first passband not higher than a first cut-off frequency, the low-pass filter including:
        a first LC resonant circuit; and
        a first acoustic wave resonator provided in a shunt circuit connecting a path leading from the first LC resonant circuit to the first signal port to a ground, the first acoustic wave resonator having a resonant frequency higher than the first cut-off frequency; and
    a high-pass filter provided between the common port and the second signal port, and configured to selectively pass a signal of a frequency within a second passband not lower than a second cut-off frequency higher than the first cut-off frequency.

2. The branching filter according to claim 1, wherein the first LC resonant circuit is an LC parallel resonant circuit including a first inductor and a first capacitor provided in parallel between the common port and the first signal port.

3. The branching filter according to claim 1, wherein the first acoustic wave resonator has an anti-resonant frequency higher than the second cut-off frequency.

4. The branching filter according to claim 1, wherein the first LC resonant circuit has a resonant frequency higher than the resonant frequency of the first acoustic wave resonator.

5. A branching filter comprising:
    a common port;
    a first signal port;
    a second signal port;
    a low-pass filter provided between the common port and the first signal port, and configured to selectively pass a signal of a frequency within a first passband not higher than a first cut-off frequency; and
    a high-pass filter provided between the common port and the second signal port, and configured to selectively pass a signal of a frequency within a second passband not lower than a second cut-off frequency higher than the first cut-off frequency, the high-pass filter including:
        a second LC resonant circuit; and
        a second acoustic wave resonator provided in a path leading from the second LC resonant circuit to the second signal port, the second acoustic wave resonator having an anti-resonant frequency lower than the second cut-off frequency.

6. The branching filter according to claim 5, wherein the second LC resonant circuit is an LC series resonant circuit including a second inductor and a second capacitor provided in series between a path leading from the common port to the second acoustic wave resonator and a ground.

7. The branching filter according to claim 5, wherein the second acoustic wave resonator has a resonant frequency lower than the first cut-off frequency.

8. The branching filter according to claim 5, wherein the second LC resonant circuit has a resonant frequency lower than the anti-resonant frequency of the second acoustic wave resonator.

9. A branching filter comprising:
    a common port;
    a first signal port;
    a second signal port;
    a low-pass filter provided between the common port and the first signal port, and configured to selectively pass a signal of a frequency within a first passband not higher than a first cut-off frequency, the low-pass filter including:
        a first LC resonant circuit; and
        a first acoustic wave resonator provided in a shunt circuit connecting a path leading from the first LC resonant circuit to the first signal port to a ground, the first acoustic wave resonator having a resonant frequency higher than the first cut-off frequency; and
    a high-pass filter provided between the common port and the second signal port, and configured to selectively pass a signal of a frequency within a second passband not lower than a second cut-off frequency higher than the first cut-off frequency, the high-pass filter including:
        a second LC resonant circuit; and
        a second acoustic wave resonator provided in a path leading from the second LC resonant circuit to the second signal port, the second acoustic wave resonator having an anti-resonant frequency lower than the second cut-off frequency.

10. The branching filter according to claim 9, wherein
    the first LC resonant circuit is an LC parallel resonant circuit including a first inductor and a first capacitor provided in parallel between the common port and the first signal port, and
    the second LC resonant circuit is an LC series resonant circuit including a second inductor and a second capacitor provided in series between a path leading from the common port to the second acoustic wave resonator and the ground.

11. The branching filter according to claim 9, wherein
    the first acoustic wave resonator has an anti-resonant frequency higher than the second cut-off frequency, and
    the second acoustic wave resonator has a resonant frequency lower than the first cut-off frequency.

12. The branching filter according to claim 9, wherein
    the first LC resonant circuit has a resonant frequency higher than the resonant frequency of the first acoustic wave resonator, and
    the second LC resonant circuit has a resonant frequency lower than the anti-resonant frequency of the second acoustic wave resonator.

* * * * *